United States Patent
Hwang et al.

(10) Patent No.: US 9,070,561 B2
(45) Date of Patent: Jun. 30, 2015

(54) SEMICONDUCTOR DEVICE AND DIE BONDING STRUCTURE THEREOF

(71) Applicant: KEC Corporation, Seoul (KR)

(72) Inventors: Kyu Hyo Hwang, Gyeongsangbuk-do (KR); Jong Hong Lee, Seoul (KR); Gab Soo Choi, Gyeongsangbuk-do (KR); Cha Soo Jeon, Daegu (KR); Jin Sang Park, Gyeongsangbuk-do (KR); Sang Bo Bae, Gyeongsangbuk-do (KR); Yong Min Park, Gyeongsangbuk-do (KR); Sung Jin An, Gyeongsangbuk-do (KR)

(73) Assignee: KEC Corporation, Seoul (KR)

( * ) Notice: Subject to any disclaimer, the term of this patent is extended or adjusted under 35 U.S.C. 154(b) by 0 days.

(21) Appl. No.: 14/515,700

(22) Filed: Oct. 16, 2014

(65) Prior Publication Data

US 2015/0123253 A1  May 7, 2015

(30) Foreign Application Priority Data

Nov. 5, 2013  (KR) .......................... 10-2013-0133760

(51) Int. Cl.
*H01L 23/00* (2006.01)
*H01L 23/495* (2006.01)

(52) U.S. Cl.
CPC .......... *H01L 24/06* (2013.01); *H01L 23/49513* (2013.01); *H01L 23/49575* (2013.01); *H01L 23/49531* (2013.01); *H01L 23/49582* (2013.01); *H01L 2224/065* (2013.01); *H01L 2924/15701* (2013.01); *H01L 2924/15724* (2013.01)

(58) Field of Classification Search
CPC .......... H01L 2924/01079; H01L 2224/13111; H01L 2224/45144; H01L 2924/01322; H01L 2924/014
See application file for complete search history.

(56) References Cited

U.S. PATENT DOCUMENTS

| 7,023,089 | B1 * | 4/2006 | Lu ................................. 257/751 |
| 2002/0149117 | A1 * | 10/2002 | Shibata ........................ 257/777 |
| 2006/0151889 | A1 | 7/2006 | Kajiwara et al. |
| 2008/0003777 | A1 | 1/2008 | Slater et al. |

FOREIGN PATENT DOCUMENTS

| JP | 2008-016843 | 1/2008 |
| KR | 10-0572151 | 4/2006 |
| KR | 10-2006-0081368 | 7/2006 |

* cited by examiner

*Primary Examiner* — Roy Potter

(57) ABSTRACT

Provided are a semiconductor device and a bonding structure thereof, in which an inter-metal compound is not formed with a semiconductor die or a lead frame, thereby improving electrical and mechanical properties and wettability and suppressing conglomeration of a die bonding material. The semiconductor device includes a semiconductor die, a barrier layer formed on a surface of the semiconductor die, a first metal layer formed on the barrier layer, a central metal layer formed on the first metal layer, and a second metal layer formed on the central metal layer. Here, the first and second metal layers have a first melting temperature, and the central metal layer has a second melting temperature lower than the first melting temperature.

16 Claims, 6 Drawing Sheets

SEMICONDUCTOR DEVICE AND DIE BONDING STRUCTURE THEREOF

CROSS-REFERENCE TO RELATED APPLICATION

This application claims priority to and the benefit of Korean Patent Application No. 10-2013-0133760 filed on Nov. 5, 2013, which is herein incorporated by reference in its entirety.

BACKGROUND OF THE INVENTION

Field of the Invention

In general, known die bonding materials of a semiconductor device include Au—$Ge_{0.15}$—$Sb_{0.17}$, Sn-90Pb, Sn-37Pb, Sn-3.5Ag, Sn-5Sb, Sn-0.7Cu and Sn-9Zn. The die bonding material serves to electrically and mechanically connect a semiconductor die to a substrate, such as a circuit board.

However, due to environmental regulations, use of lead (Pb) or antimony (Sb) is prohibited, and gold (Au) may increase the manufacturing cost of the semiconductor device.

In addition, a tin silver (SnAg) alloy may form an intermetal compound with nickel (Ni) formed on the semiconductor die or with copper (Cu) of a lead frame, thereby lowering electrical and mechanical properties. Further, when silver (Ag) is deposited, tin (Sn) may conglomerate due to accumulation of heat energy, so that many voids are created in the die bonding material. In addition, surface roughness of the die bonding material may increase, thereby lowering the reliability in wetting and bonding properties of the lead frame.

Further limitations and disadvantages of conventional and traditional approaches will become apparent to one of skill in the art, through comparison of such systems with the present disclosure as set forth in the remainder of the present application with reference to the drawings.

SUMMARY OF THE INVENTION

Aspects of the present invention provide a semiconductor device and a bonding structure thereof, in which an intermetal compound is not formed with a semiconductor die or a lead frame, thereby improving electrical and mechanical properties and wettability and suppressing conglomeration of a die bonding material.

In accordance with one aspect of the present invention, there is provided a semiconductor device including a semiconductor die, a barrier layer formed on a surface of the semiconductor die, a first metal layer formed on the barrier layer, a central metal layer formed on the first metal layer, and a second metal layer formed on the central metal layer, wherein the first and second metal layers have a first melting temperature, and the central metal layer has a second melting temperature lower than the first melting temperature.

The first melting temperature may be in a range of 400 to 1500° C. and the second melting temperature may be in a range of 100 to 500° C.

The central metal layer may include tin (Sn), bismuth (Bi) or indium (In) and each of the first metal layer and the second metal layer may include silver (Ag), gold (Au), Nickel (Ni), germanium (Ge), antimony (Sb), cobalt (Co), Copper (Cu), aluminum (Al), silicon (Si), zinc (Zn), or magnesium (Mg).

A weight ratio between the central metal layer and the first and second metal layers may be in a range of 9.5:0.5 to 6:4.

Thicknesses of the central metal layer, the first metal layer and the second metal layer may range in a descending order, that is, central metal layer>first metal layer>second metal layer.

The central metal layer may have a thickness in a range of 8000 Å to 30000 Å, the first metal layer has a thickness in a range of 300 Å to 10000 Å, and the second metal layer may have a thickness in a range of 300 Å to 10000 Å.

The central metal layer may have a thickness in a range of 15000 to 21000 Å, the first metal layer may have a thickness in a range of 2000 Å to 4000 Å, and the second metal layer may have a thickness in a range of 300 Å to 2000 Å.

The barrier layer may be made of titanium (Ti) or titanium (Ti) and nickel (Ni) sequentially formed, and the barrier layer may be made of vanadium (V) or vanadium (V) and nickel (Ni) sequentially formed.

According to embodiments the present invention, there is provided a die bonding structure including a semiconductor die, a lead frame electrically connected to the semiconductor die, and a tin silver (SnAg) alloy electrically connected to the semiconductor die and the lead frame, wherein a die bonding temperature of the tin silver alloy is in a range of 220° C. to 450° C., and a remelting temperature of the tin silver alloy is in a range of 280° C. to 500° C.

Here, a weight ratio of the tin silver alloy between tin (Sn) and silver (Ag) may be in a range of 9.5:0.5 to 6:4.

As described above, according to an embodiment of the present invention, a semiconductor device and a bonding structure thereof are provided, which can improve electrical and mechanical properties and wettability and suppressing conglomeration of a die bonding material by employing a silver-tin-silver (Ag—Sn—Ag) structure as a back side metal material as the die bonding material of the semiconductor device to prevent an inter-metal compound from being formed between the bonding material and a metal layer of a semiconductor die or a lead frame.

In particular, in an embodiment of the present invention, during die bonding, a central tin (Sn) in a silver-tin-silver (Ag—Sn—Ag) structure is first melted to function as a solvent and upper silver (Ag) and lower silver (Ag) (functioning as a solute) are then melted, thereby allowing the die bonding to be performed at a low temperature around a melting point of tin (Sn) (e.g., 250° C.)

In the semiconductor device and the die bonding structure thereof according to an embodiment of the present invention, when silver-tin-silver (Ag—Sn—Ag) is subjected to die bonding to become a tin silver (SnAg) alloy, a final melting point is increased according to a weight ratio of tin silver (SnAg) designed, thereby lowering a die bonding temperature and increasing a remelting temperature.

Various advantages, aspects and novel features of the present disclosure, as well as details of an illustrated embodiment thereof, will be more fully understood from the following description and drawings.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present disclosure will be described in detail with reference to the accompanying drawings in such a manner that the technical idea of the present disclosure may easily be carried out by a person with ordinary skill in the art to which the invention pertains. Objects, operations, effects, other objects, characteristics and advantages of the present disclosure will be easily understood from an explanation of a preferred embodiment that will be described in detail below by reference to the attached drawings.

Although embodiments have been described with reference to illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

Figure 1A:
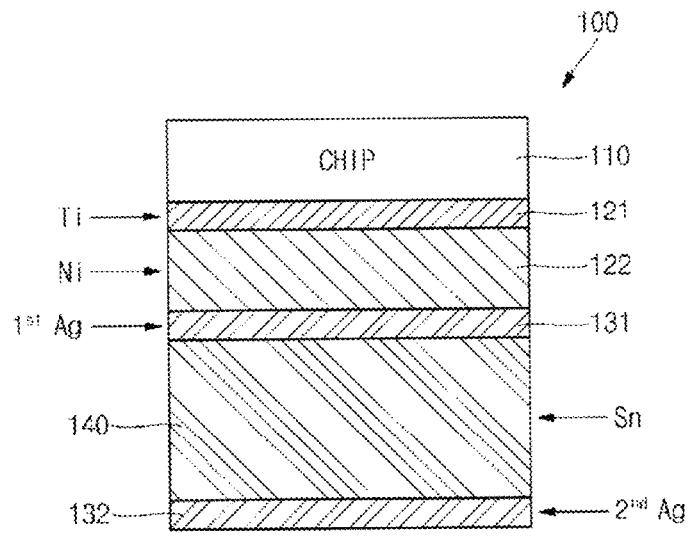
FIG. 1A is a cross-sectional view illustrating a semiconductor device according to an embodiment of the present invention and FIG. 1B is a cross-sectional view illustrating a state before a semiconductor die and a lead frame are not subjected to a die bonding process.
Figure 1B:
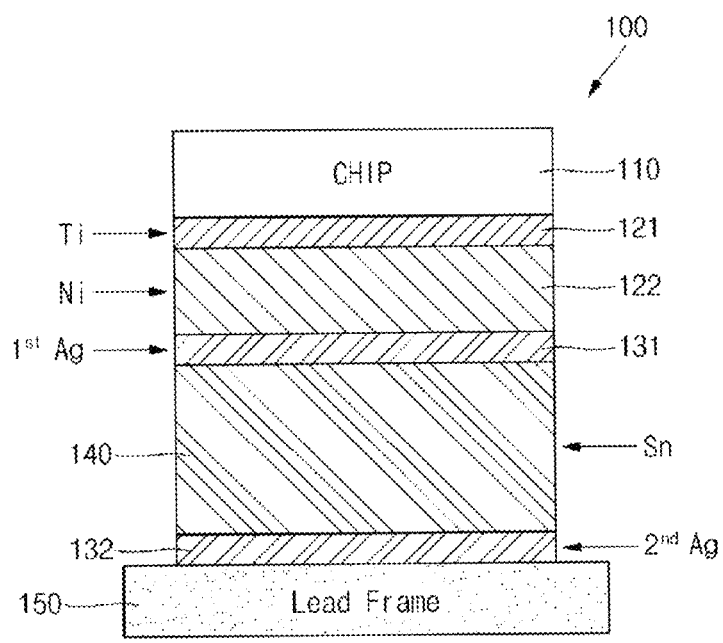

FIG. 1A is a cross-sectional view illustrating a semiconductor device according to an embodiment of the present invention and FIG. 1B is a cross-sectional view illustrating a state before a semiconductor die and a lead frame are not subjected to a die bonding process.

As illustrated in FIGS. 1A and 1B, the semiconductor device 100 according to the present invention includes a semiconductor die 110, barrier layers 121 and 122, a first metal layer 131, a central metal layer 140 and a second metal layer 132.

The semiconductor die 110 may be generally at least one selected from the group consisting of a metal oxide silicon field effect transistor (MOSFET), an insulated gate bipolar mode transistor (IGBT), a diode, a transient voltage suppressor (TVS) and equivalents thereof, but the present invention does not limit the kind of the semiconductor die 110 to that listed herein.

The barrier layers 121 and 122 may include titanium (Ti) or titanium (Ti) and nickel (Ni) sequentially formed. In addition, the barrier layers 121 and 122 may include vanadium (V) or vanadium (V) and nickel (Ni) sequentially formed.

Here, titanium (Ti) or vanadium (V) may be defined as a first barrier layer 121 and nickel (Ni) may be defined as a second barrier layer 122. The first barrier layer 121 may prevent the first and second metal layers 131 and 132 or the central metal layer 140 to be described later from being diffused to the semiconductor die 110 and the second barrier layer 122 may prevent the first and second metal layers 131 and 132 or the central metal layer 140 from being diffused to the first barrier layer 121. In the illustrated embodiment, the first and second barrier layers 121 and 122 include titanium (Ti) or vanadium (V) and nickel (Ni), but the present invention does not limit the materials of the first and second barrier layers 121 and 122 to those listed herein.

The first metal layer 131 is formed on the second barrier layer 122. In an exemplary embodiment, the first metal layer 131 may include silver (Ag), gold (Au), nickel (Ni), germanium (Ge), antimony (Sb), cobalt (Co), copper (Cu), aluminum (Al), silicon (Si), zinc (Zn), magnesium (Mg) or an equivalent thereof, which has a first melting temperature in a range of approximately 400° C. to approximately 1500° C. The first metal layer 131 may prevent the central metal layer 140 and the second barrier layer 122 from forming an inter-metal compound. In an exemplary embodiment, since silver (Ag) and nickel (Ni) form a eutectic alloy, no inter-metal compound is formed. Therefore, since a brittle inter-metal compound (e.g., Ni3Sn4 or Ni2Sn2) is not formed from the central metal layer 140 and the second barrier layer 122, electrical and mechanical properties are improved. In addition, since the central metal layer 140 is not diffused into the first barrier layer 121 by the first metal layer 131, a stacked structure of the first metal layer 131 and the central metal layer 140 becomes more stabilized. In addition, since the first metal layer 131 has lower surface energy than the central metal layer 140, conglomeration of the central metal layer 140 may also be suppressed.

Here, the first metal layer 131 may have a thickness in a range of approximately 300 Å to approximately 10000 Å, preferably in a range of approximately 500 Å to approximately 5000 Å, and more preferably in a range of approximately 2000 Å to approximately 4000 Å.

The central metal layer 140 is formed on the first metal layer 131. In an exemplary embodiment, the central metal layer 140 may include tin (Sn), bismuth (Bi), indium (In) or an equivalent thereof, having a second melting temperature in a range of approximately 100° C. to approximately 500° C. The central metal layer 140 is a main component of a die bonding material for electrically connecting the semiconductor die 110 to a lead frame 150 and serves to reduce a bonding temperature of the die bonding material. In an exemplary embodiment, the bonding temperature of the die bonding material is reduced to approximately 220° C. to approximately 450° C., preferably to approximately 280° C. to approximately 500° C., by the central metal layer 140. Moreover, a remelting temperature after the die bonding is increased to approximately 280° C. to approximately 500° C., preferably to approximately 400° C. to approximately 500° C., so that the die bonding material according to the present invention is not remelted during another manufacturing process (for example, wire bonding (200° C. to 300° C.) or encapsulating (200° C. to 300° C.) or during mounting of another electronic component.

Here, the central metal layer 140 may be formed to have a thickness in a range of approximately 8000 Å to approximately 30000 Å, preferably in a range of approximately 8000 Å to approximately 28000 Å, and more preferably in a range of approximately 15000 Å to approximately 21000 Å.

The second metal layer 132 is formed on the 0 central metal layer 140. In an exemplary embodiment, the second metal layer 132 may include silver (Ag), gold (Au), nickel (Ni), germanium (Ge), antimony (Sb), cobalt (Co), Copper (Cu), aluminum (Al), silicon (Si), zinc (Zn), magnesium (Mg) or a combination thereof, having a first melting temperature in a range of approximately 400° C. to approximately 1500° C. The second metal layer 132 prevents the central metal layer 140 as a non-metal from being oxidized.

In addition, the second metal layer 132 prevents an inter-metal compound from being formed between the central metal layer 140 and the lead frame 150. In an exemplary embodiment, since silver (Ag) and copper (Cu) form a eutectic alloy, an inter-metal compound is not formed. Therefore, a brittle inter-metal compound (e.g., $Cu_6Sn_5$) is not formed from the central metal layer 140 and the lead frame 150, thereby improving electrical and mechanical properties. Moreover, wettability to the lead frame 150 is improved by the second metal layer 132, thereby further improving the electrical and mechanical properties.

Here, the second metal layer 132 may be formed to have a thickness in a range of approximately 300 Å to approximately 10000 Å, preferably in a range of approximately 500 Å to approximately 2500 Å, and more preferably in a range of approximately 1000 Å to approximately 2000 Å.

FIG. 1B illustrates the lead frame 150 to be connected to the semiconductor die 110, but aspects of the present invention are not limited thereto. In an exemplary embodiment, instead of the lead frame 150, a rigid printed circuit board or a flexible printed circuit board may be used. In addition, the concept of the lead frame defined in the appended claims encompasses the rigid printed circuit board or the flexible printed circuit board.

Figure 2:
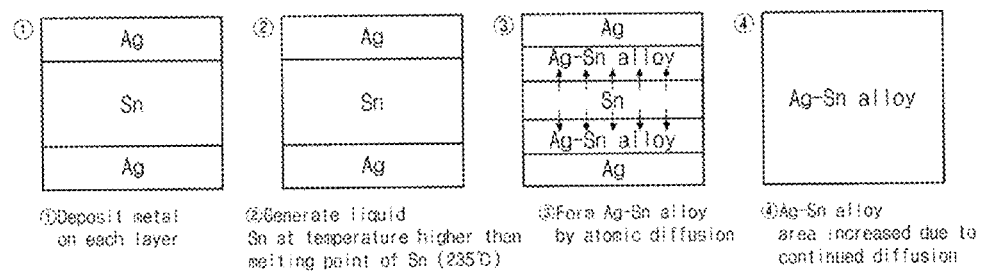
FIG. 2 illustrates die bonding mechanism using a semiconductor device according to an embodiment of the present invention.

FIG. 2 illustrates die bonding mechanism using a semiconductor device according to an embodiment of the present invention.

As illustrated in FIG. 2, die bonding material layers consisting of the first metal layer 131, the central metal layer 140 and the second metal layer 132, that is, sandwiched back side metal layers, are melted with respect to each other during die bonding, thereby forming, for example, tin silver (SnAg) alloy. Here, the die bonding (D/B) temperature may be in a range of approximately 220° C. to approximately 450° C., preferably in a range of approximately 220° C. to approximately 400° C., as described above. The tin silver (SnAg) alloy may also be called a silver tin (AgSn) alloy.

The die bonding process will now be described in sequence. As in step ①, die bonding material layers including the first metal layer 131, the central metal layer 140 and the second metal layer 132 disposed in a sandwiched configuration, that is, back side metal layers, are supplied to a back side of the semiconductor die 110 and the back side metal layers are positioned on the lead frame 150. Next, as in step ②, if the D/B temperature in the range of approximately 220° C. to approximately 450° C. is provided, the central metal layer 140 is first melted to then turn into a liquid phase. At this stage, the first metal layer 131 and the second metal layer 132 are still in solid phases. Next, as in step ③, if the D/B temperature is maintained for a predetermined time, the first and second metal layers 131 and 132 being in solid phases are melted to then be dissolved in the central metal layer 140 being in a liquid phase, thereby forming a tin silver (SnAg) alloy layer, which is similar to the principle in which salt is dissolved in water to become brine. Finally, as in step ④, if the D/B temperature is further maintained for a predetermined time, the first and second metal layers 131 and 132 being in solid phases are completely dissolved in the liquid-phase central metal layer 140, thereby forming a tin silver (SnAg) alloy layer for electrically connecting the semiconductor die 110 to the lead frame 150. Further, the D/B temperature is cancelled to perform a cooling process, thereby obtaining the solid-phase tin silver (SnAg) alloy layer.

That is to say, before the die bonding process is performed, the die bonding material layer exists in a silver-tin-silver sandwiched configuration. However, after the die bonding process is performed, the die bonding material layer exists as tin silver (SnAg) alloy layer.

Meanwhile, once the tin silver (SnAg) alloy layer is formed, in order to remelt the formed tin silver (SnAg) alloy layer, it is necessary to provide a temperature in a range of approximately 280° C. to approximately 500° C., and preferably in a range of approximately 400° C. to approximately 500° C., which is higher than the D/B temperature. Therefore, if the semiconductor device 100 according to the present invention is die-bonded to the lead frame 150, the tin silver (SnAg) alloy layer is not remelted in a subsequent wire bonding or encapsulating process or a reflow process of another electronic component.

In more detail, when the tin silver (SnAg) alloy is obtained from a silver-tin-silver (Ag—Sn—Ag) structure, the remelting temperature of the tin silver (SnAg) alloy is determined according to the weight ratio of the tin silver (SnAg) alloy. In an exemplary embodiment, the remelting temperature of $Sn_{95}Ag_5$ is determined to be approximately 230° C. In another exemplary embodiment, the remelting temperature of $Sn_{90}Ag_{10}$ is determined to be approximately 300° C. The remelting temperature depending on the weight ratio is shown in FIG. 3.

As described above, the present invention provides a relatively low D/B temperature, thereby suppressing failures, such as popping/lifting phenomena in which a semiconductor die and a lead frame are separated from each other due to a difference in the thermal expansion coefficient between the semiconductor die and the lead frame. In addition, while bonding is performed at a relatively low temperature, the remelting is controlled to be performed at a relatively high temperature according to the composition ratio of the tin silver (SnAg) alloy layer, so that the die bonding structure of the present invention is not affected by another manufacturing process or mounting of another electronic component.

Figure 3:
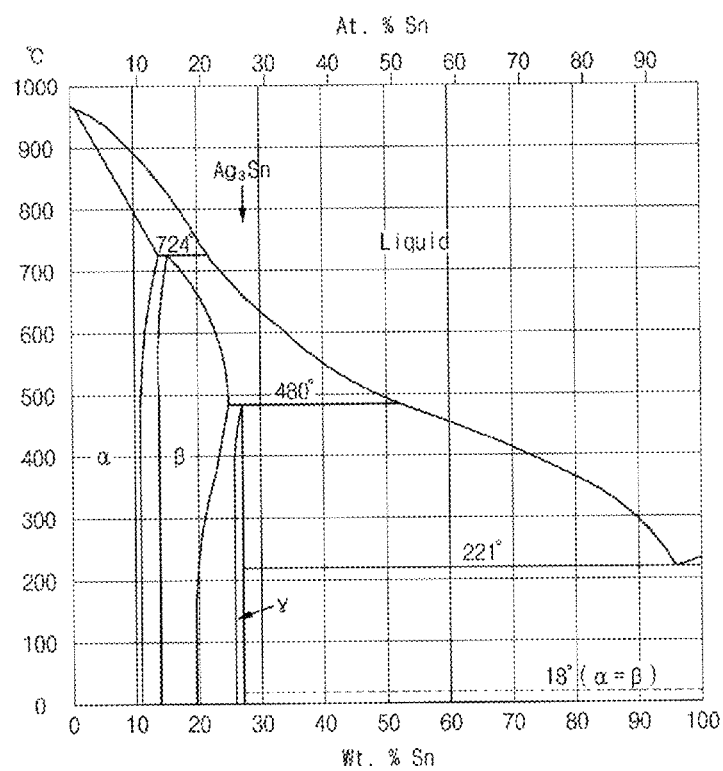
FIG. 3 is a state diagram illustrating a phase change state of tin silver (SnAg) used in the present invention.

FIG. 3 is a state diagram illustrating a phase change state of tin silver (SnAg) used in the present invention.

In FIG. 3, the X axis indicates weight ratio (wt %) of tin (Sn) relative to silver (Ag) and the Y axis indicates the temperature. As illustrated in FIG. 3, pure tin (Sn) has a melting point of approximately 231° C. and pure silver (Ag) has a melting point of approximately 961° C.

Meanwhile, the semiconductor device 100 according to the present invention includes the first metal layer 131, the central metal layer 140 and the second metal layer 132 disposed in a sandwiched configuration. However, once die-bonding to the lead frame 150 is performed, the semiconductor device 100 includes a tin silver (SnAg) alloy layer. The tin silver (SnAg) alloy layer may be controlled to have a weight ratio in a range of approximately 9.5:0.5 to approximately 6:4, preferably in a range of approximately 9:1 to approximately 7:3. Therefore, the D/B temperature of the tin silver (SnAg) alloy layer may be controlled to be in a range of approximately 220° C. to approximately 450° C., preferably in a range of approximately 220° C. to approximately 400° C. In addition, as described above, after the tin silver (SnAg) alloy layer is formed by the bonding, it may have a remelting temperature in a range of approximately 280° C. to approximately 500° C., preferably in a range of approximately 400° C. to approximately 500° C.

EXAMPLES

Figure 4:
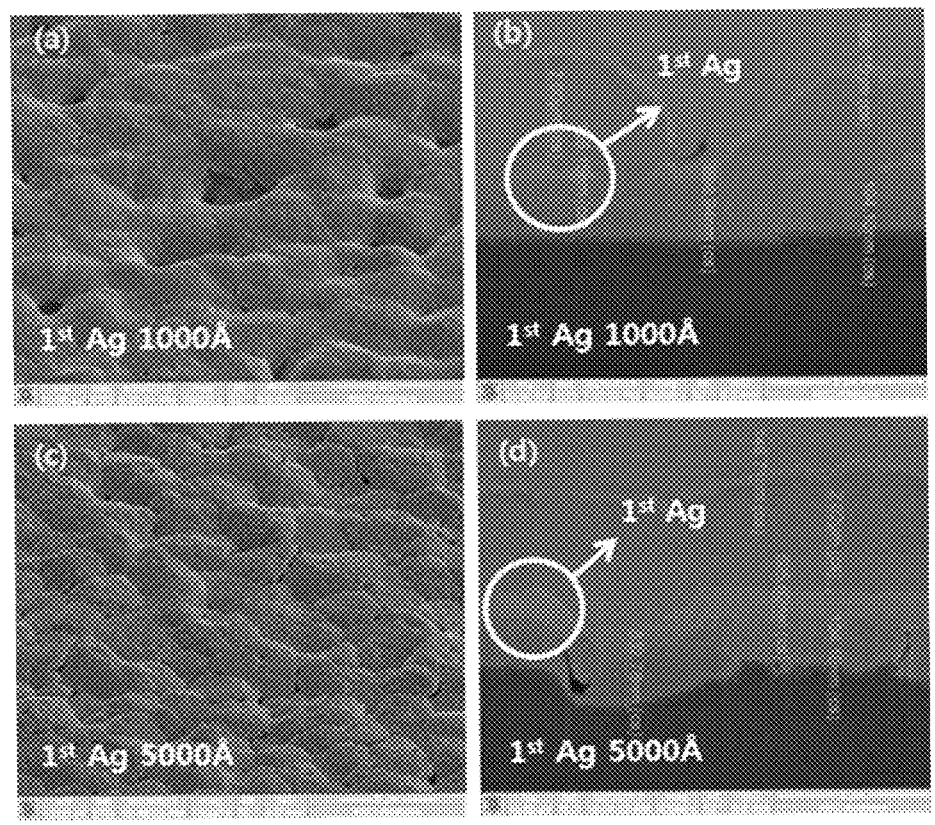
FIG. 4 illustrates photographs for explaining effects depending on a change in the thickness of a first metal layer according to an embodiment of the present invention.

FIG. 4 illustrates photographs for explaining effects depending on a change in the thickness of a first metal layer according to an embodiment of the present invention.

In FIG. 4, (a) and (b) illustrate a 3D photograph and a sectional photograph after the first metal layer 131 (e.g., silver) having a thickness of approximately 1000 Å is formed and the central metal layer 140 (e.g., tin) is then formed. As illustrated in (a) and (b) of FIG. 4, the first metal layer 131 has a relatively small thickness, so that the second barrier layer 122 (e.g., nickel) is not entirely covered. Accordingly, as the central metal layer 140 directly reacts with the second barrier layer 122, conglomeration may be observed. That is to say, since the first metal layer 131 cannot sufficiently reduce the surface energy of the central metal layer 140, conglomeration of the die bonding material is observed from the surface of the bonding material.

In FIG. 4, (c) and (d) illustrate a 3D photograph and a sectional photograph after the first metal layer 131 (e.g., silver) having a thickness of approximately 5000 Å is formed and the central metal layer 140 (e.g., tin) is then formed. As illustrated in (c) and (d) of FIG. 4, the first metal layer 131 has a relatively large thickness, so that the second barrier layer 122 (e.g., nickel) is entirely covered. Accordingly, as the first metal layer 131 sufficiently reduces surface energy of the central metal layer 140, a surface of the die bonding material may become substantially planar.

Figure 5:
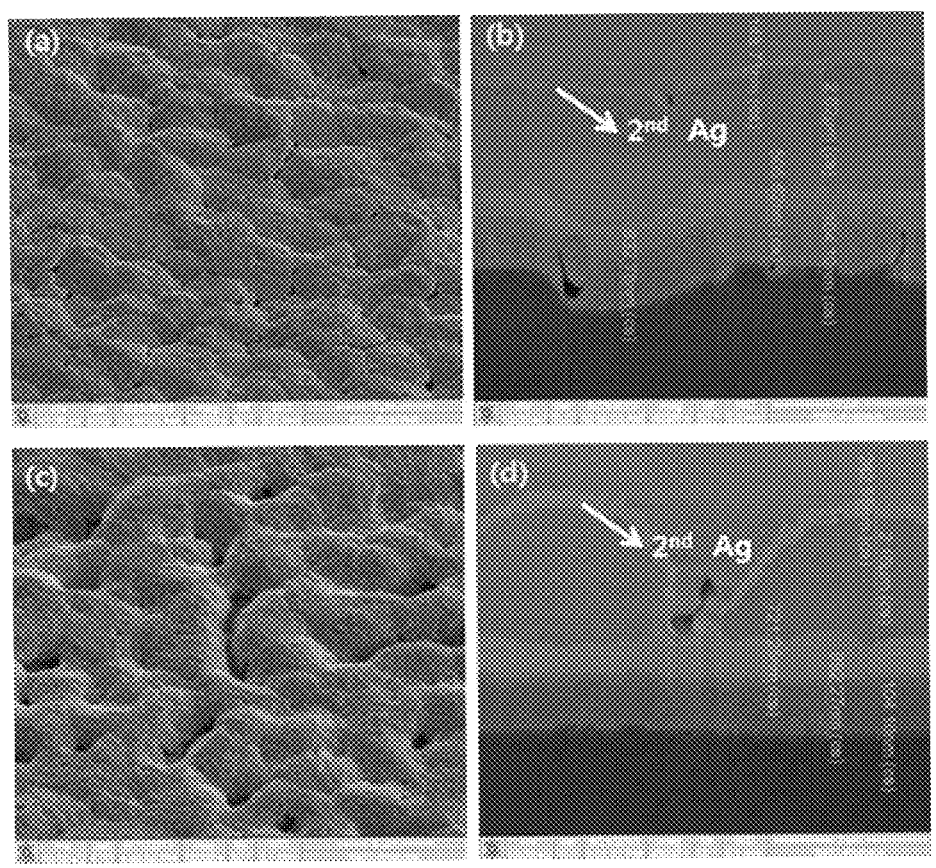
FIG. 5 illustrates photographs for explaining effects depending on a change in the thickness of a second metal layer according to an embodiment of the present invention.

FIG. 5 illustrates photographs for explaining effects depending on a change in the thickness of a second metal layer according to an embodiment of the present invention.

In FIG. 5, (a) and (b) illustrate a 3D photograph and a sectional photograph after the first metal layer 131 (e.g., silver) and the central metal layer 140 (e.g., tin) are formed and the second metal layer 132 (e.g., silver) having a thickness of approximately 1500 Å is then formed. As illustrated in (a) and (b) of FIG. 4, the second metal layer 132 (e.g., silver) having a thickness of approximately 1500 Å is then formed. As illustrated in (a) and (b) of FIG. 5, a surface of the die bonding material may become substantially planar.

In FIG. 5, (c) and (d) illustrate a 3D photograph and a sectional photograph after the first metal layer 131 (e.g., silver) and the central metal layer 140 (e.g., tin) are formed and the second metal layer 132 (e.g., silver) having a thickness of approximately 3000 Å is then formed. As illustrated in (c) and (d) of FIG. 5, as a deposition thickness of the second metal layer 132 is increased, heat energy derived from electron beams may accumulate, conglomeration of the die bonding material is observed from the surface of the bonding material.

As confirmed from the experimental example, in the stacked structure (sandwiched configuration) of the first metal layer 131 (silver), the central metal layer 140 (tin) and the second metal layer 132 (silver), the second metal layer 132 suppresses an inter-metal compound from being formed with tin copper (Sn—Cu), prevents the central metal layer 140 from being oxidized and reduces surface roughness, thereby improving electrical and mechanical properties of the semiconductor device 100.

If the thickness of the first metal layer 131 (silver) is too small, the first metal layer 131 cannot serve as a barrier. Accordingly, since the central metal layer 140 conglomerates, the first metal layer 131 should have a sufficiently large thickness. In addition, as a deposition thickness of the second metal layer 132 (silver) is increased, the central metal layer 140 is supplied with heat energy for an extended time, resulting in accumulation. Thus, as the thickness of the second metal layer 132 is reduced, the second metal layer 132 may have a planar surface.

Here, as a chamber temperature is reduced during a deposition process, the surface energy of the central metal layer 140 is reduced, so that the surface of the central metal layer 140 becomes more planar.

In conclusion, in order to obtain a planar surface of the die bonding material, the first metal layer 131 is formed to have a sufficiently large thickness and the second metal layer 132 is formed to have a sufficiently small thickness. In addition, during deposition of the first and second metal layers 131 and 132 and the central metal layer 140, a chamber should be maintained at a low temperature.

Here, it was confirmed that the more flatly shaped the surface, the better the temperature distribution during die bonding. In addition, it was confirmed that the sandwiched back side metal layer structure according to the present invention is die-bonded at a melting point of the central metal layer 140 (tin) (e.g., approximately 250° C.) Further, it was also confirmed that re-melting actually took place at a melting point of the tin silver (SnAg) alloy (e.g., approximately 350° C.).

Figure 6:
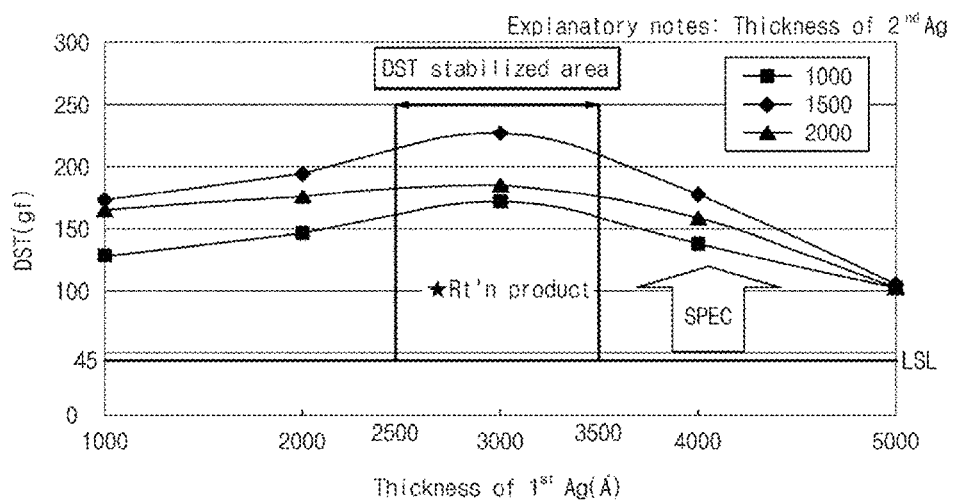
FIG. 6 is a graph illustrating die shear strengths depending on a change in the thickness of a first metal layer according to an embodiment of the present invention.

FIG. 6 is a graph illustrating die shear strengths depending on a change in the thickness of a first metal layer according to an embodiment of the present invention Here, the die shear strength test (DST) is performed such that the semiconductor die 110 is connected to the lead frame 150 using a die bonding material and one side of the semiconductor die 110 is then pushed using a shear blade. That is to say, a die shear strength is a value of a force applied when the semiconductor die 110 is separated from the lead frame 150. The DST method is widely known to one skilled in the art and a detailed description thereof will not be given.

In FIG. 6, the X axis indicates the thickness of the first metal layer 131 (silver) and the Y axis indicates the die shear strength. Here, the second metal layer 132 (silver) has thicknesses of 1000 Å, 1500 Å and 2000 Å.

As illustrated in FIG. 6, when the first metal layer 131 has a thickness in a range of 1000 to 4000 Å, it had high die shear strengths, that is, greater than or equal to 100 gf relative to the test specification level, that is, 45 gf. In particular, the DST stabilized area was demonstrated when the thickness of the first metal layer 131 was in a range of approximately 2500 Å to approximately 3500 Å, thereby obtaining a sufficiently good quality margin of die bonding in view of yield. In FIG. 6, Rt'n product means a conventional product.

Figure 7:
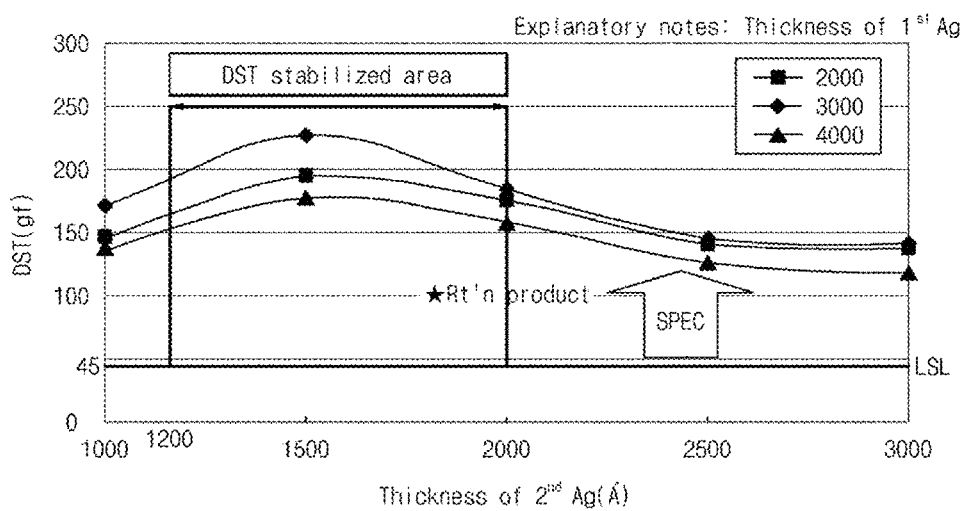
FIG. 7 is a graph illustrating die shear strengths depending on a change in the thickness of a second metal layer according to an embodiment of the present invention.

FIG. 7 is a graph illustrating die shear strengths depending on a change in the thickness of a second metal layer according to an embodiment of the present invention.

In FIG. 7, the X axis indicates the thickness of the second metal layer 132 (silver) and the Y axis indicates the die shear strength. Here, the first metal layer 131 (silver) has thicknesses of 2000 Å, 3000 Å and 4000 Å.

As illustrated in FIG. 7, when the second metal layer 132 has a thickness in a range of 1000 to 4000 Å, it had high die shear strengths, that is, greater than or equal to 100 gf relative to the test specification level (SPEC), that is, 45 gf. In particular, the DST stabilized area was demonstrated when the thickness of the second metal layer 132 was in a range of approximately 1200 Å to approximately 2000 Å, thereby obtaining a sufficiently good quality margin of die bonding in view of yield.

Figure 8:
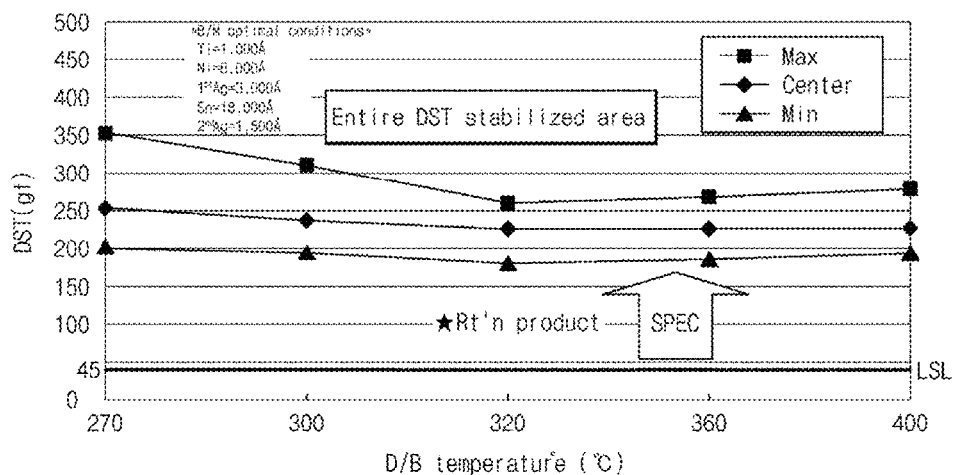
FIG. 8 is a graph illustrating die shear strengths depending on die bonding (D/B) temperatures according to an embodiment of the present invention.

FIG. 8 is a graph illustrating die shear strengths depending on die bonding (D/B) temperatures according to an embodiment of the present invention.

In FIG. 8, the X axis indicates the die bonding (D/B) temperature and the Y axis indicates the die shear strength. Here, the die shear strength may be defined as a maximum value (Max), a center value (Center) and a minimum value (Min).

As illustrated in FIG. 8, the die shear strength was good, that is, greater than or equal to 150 gf relative to the test specification level (SPEC), that is, 45 gf, over the entire range of approximately 270° C. to approximately 400° C. in the D/B temperature. In particular, the DST stabilized area was demonstrated when the D/B temperature was in a range of approximately 270° C. to approximately 400° C., thereby obtaining a sufficiently good quality margin of die bonding in view of yield.

In a die bonding material structure, that is, a back side metal layer structure (B/M), titanium (Ti) of approximately 1000 Å was used as the first barrier layer 121, nickel (Ni) of approximately 8000 Å was used as the second barrier layer 122, silver (1st Ag) of approximately 3000 Å was used as the first metal layer 131, tin (Sn) of approximately 18000 Å was used as the central metal layer 140 and silver (2nd Ag) of approximately 1500 Å was used as the second metal layer 132.

Figure 9:
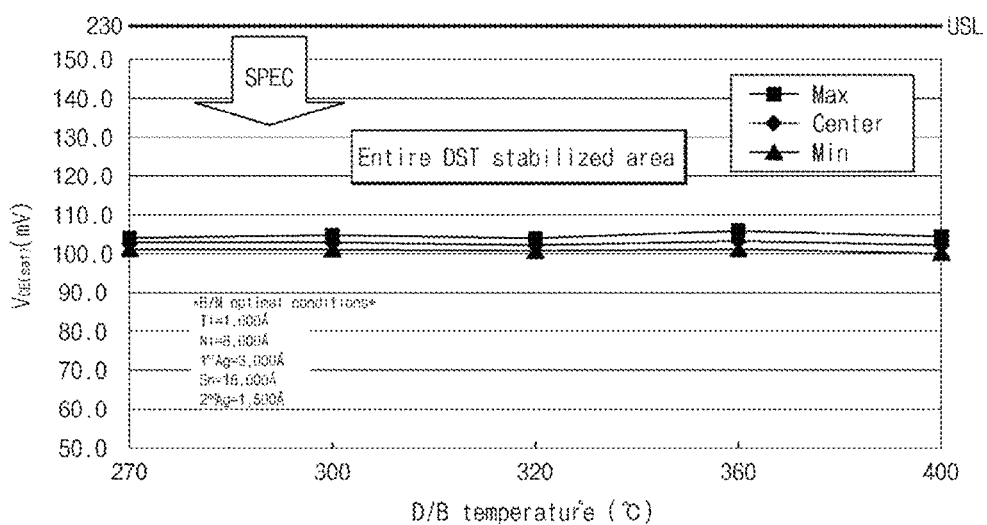
FIG. 9 is a graph illustrating saturation voltages depending on die bonding (D/B) temperatures according to an embodiment of the present invention.

FIG. 9 is a graph illustrating saturation voltages depending on die bonding (D/B) temperatures according to an embodiment of the present invention.

In FIG. 9, the X axis indicates the D/B temperature and the Y axis indicates the saturation voltage applied between a collector and an emitter.

As illustrated in FIG. 9, the saturation voltage was good, that is, less than or equal to 110 mV relative to the test specification level (SPEC), that is, 130 mV, over the entire range of approximately 270° C. to approximately 400° C. in the D/B temperature. In addition, all saturation voltages were included in the D/B temperature range stated above, thereby obtaining a sufficiently good quality margin of die bonding in view of yield.

Table 1 shows results of electrical tests performed on products according to an embodiment of the present invention.

TABLE 1

|  | Test Condition | SPEC | Conventional product | Inventive product |
|---|---|---|---|---|
| $V_{CBO}$ | $I_C$ = 100 uA | Min 60 V | 122.7 V | 125.8 V |
| $V_{CEO}$ | $I_C$ = 1 mA | Min 50 V | 71.5 V | 72.8 V |
| $V_{EBO}$ | $I_E$ = 100 uA | Min 5 V | 7.97 V | 8.09 V |
| $h_{FE}$ | $V_{CE}$ = 6 V, $I_C$ = 2 mA | 120~240 | 155.0 | 150.6 |
| $V_{CE(sat)}$ (V) | $I_C$ = 100 mA, $I_B$ = 10 mA | Max 0.25 V | 96.2 mV | 102.1 mV |

As listed in Table 1, inventive products generally demonstrated substantially equal DC characteristics to those of conventional products and satisfied all items of test specification levels. In particular, ICMAX of the inventive product was equal to that of the conventional product, which is satisfactory to the test specification level. In addition, VCE(sat) of the inventive product was equal to that of the conventional product, which is satisfactory to the test specification level. Therefore, since the inventive products satisfy all electrical properties of test specification levels, commercialization of the inventive products can be adequately achieved.

Table 2 shows results of reliability tests of products according to an embodiment of the present invention.

TABLE 2

|  |  | Conventional product | Inventive product | | | Result |
|---|---|---|---|---|---|---|
|  |  |  | D/B 270° C. | D/B 320° C. | D/B 400° C. |  |
| Life test | SSOL, H3TRB | 0/44 | 0/44 | 0/44 | 0/44 | 168 hr, OK |
| Environmental test | SHT, TCT, TFT | 0/175 | 0/175 | 0/175 | 0/175 | 168 hr, OK |

As listed in Table 2, when the reliability was evaluated, it was confirmed there was no difference in the reliability between the conventional product and the inventive product. In an exemplary embodiment, when the temperature cycling test was performed on tin (Sn) that is weak to heat, stability in physical properties of tin (Sn) was obtained. In addition, when the thermal fatigue test was performed on tin (Sn) that is brittle, mechanical strength and stability against thermal fatigue were obtained. Therefore, since the inventive products satisfy all mechanical properties of test specification levels, commercialization of the inventive products can be adequately achieved.

Here, SSOL denotes a steady state operational life test and H3TRB denotes a high humidity high temperature reverse bias test, which are widely known to one skilled in the art and repeated descriptions thereof will not be given. In addition, SHT denotes a solder heating test, TCT denotes a temperature cycling test, TFT denotes a thermal fatigue test, which are also widely known to one skilled in the art and repeated descriptions thereof will not be given.

Although the semiconductor device and the bonding structure thereof according to a specific embodiment of the present invention have been described in detail hereinabove, it should be clearly understood that many variations and/or modifications of the basic inventive concepts herein taught which may appear to those skilled in the art still fall within the spirit and scope of the present invention as defined in the appended claims.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A semiconductor device comprising:
   a semiconductor die;
   a barrier layer formed on a surface of the semiconductor die;
   a first metal layer formed on the barrier layer;
   a central metal layer formed on the first metal layer; and
   a second metal layer formed on the central metal layer,
   wherein the first and second metal layers have a first melting temperature, and the central metal layer has a second melting temperature lower than the first melting temperature,
   wherein a weight ratio between the central metal layer and the first and second metal layers is in a range of 9.5:0.5 to 6:4.

2. The semiconductor device of claim 1, wherein the first melting temperature is in a range of 400 to 1500° C. and the second melting temperature is in a range of 100 to 500° C.

3. The semiconductor device of claim 1, wherein the central metal layer includes tin (Sn), bismuth (Bi) or indium (In) and each of the first metal layer and the second metal layer includes silver (Ag), gold (Au), Nickel (Ni), germanium (Ge), antimony (Sb), cobalt (Co), Copper (Cu), aluminum (Al), silicon (Si), zinc (Zn), or magnesium (Mg).

4. A semiconductor device comprising:
   a semiconductor die;
   a barrier layer formed on a surface of the semiconductor die;
   a first metal layer formed on the barrier layer;
   a central metal layer formed on the first metal layer; and
   a second metal layer formed on the central metal layer,
   wherein the first and second metal layers have a first melting temperature, and the central metal layer has a second melting temperature lower than the first melting temperature,
   wherein thicknesses of the central metal layer, the first metal layer and the second metal layer range in a descending order: central metal layer >first metal layer >second metal layer.

5. The semiconductor device of claim 1, wherein the central metal layer has a thickness in a range of 8000 Å to 30000 Å, the first metal layer has a thickness in a range of 300 Å to 10000 Å, and the second metal layer has a thickness in a range of 300 Å to 10000 Å.

6. The semiconductor device of claim 1, wherein the central metal layer has a thickness in a range of 15000 to 21000 Å, the first metal layer has a thickness in a range of 2000 Å to 4000 Å, and the second metal layer has a thickness in a range of 300 Å to 2000 Å.

7. The semiconductor device of claim 1, wherein the barrier layer is made of titanium (Ti) or titanium (Ti) and nickel (Ni) sequentially formed.

8. The semiconductor device of claim 1, wherein the barrier layer is made of vanadium (V) or vanadium (V) and nickel (Ni) sequentially formed.

9. The semiconductor device of claim 4, wherein the central metal layer has a thickness in a range of 15000 to 21000 Å, the first metal layer has a thickness in a range of 2000 Å to 4000 Å, and the second metal layer has a thickness in a range of 300 Å to 2000 Å.

10. A die bonding structure comprising:
    a semiconductor die;
    a lead frame electrically connected to the semiconductor die; and
    a tin silver (SnAg) alloy electrically connected to the semiconductor die and the lead frame,
    wherein a die bonding temperature of the tin silver alloy is in a range of 220° C. to 450° C., and a remelting temperature of the tin silver alloy is in a range of 280° C. to 500° C.

11. The die bonding structure of claim 10 further comprising:
    a barrier layer formed on a surface of the semiconductor die; and
    a first metal layer formed on between the barrier layer and the tin silver (SnAg) alloy.

12. The die bonding structure of claim 8, wherein a weight ratio of the tin silver alloy between tin (Sn) and silver (Ag) is in a range of 9.5:0.5 to 6:4.

13. The die bonding structure of claim 11, wherein the first metal layer includes silver (Ag), gold (Au), Nickel (Ni), germanium (Ge), antimony (Sb), cobalt (Co), Copper (Cu), aluminum (Al), silicon (Si), zinc (Zn), or magnesium (Mg).

14. The die bonding structure of claim 11, wherein the barrier layer is made of titanium (Ti) or titanium (Ti) and nickel (Ni) sequentially formed.

15. The die bonding structure of claim 11, wherein the barrier layer is made of vanadium (V) or vanadium (V) and nickel (Ni) sequentially formed.

16. The die bonding structure of claim 11, wherein the first metal layer has a thickness in a range of 2000 Å to 4000 Å.

* * * * *